United States Patent
Furuya et al.

(10) Patent No.: US 6,927,648 B2
(45) Date of Patent: Aug. 9, 2005

(54) MULTIPLEXER

(75) Inventors: Shinji Furuya, deceased, late of Ube (JP); by Yoshiko Furuya, legal representative, Yamaguchi (JP); Hiroshi Ichikawa, Ube (JP); Ryuji Oyama, Ube (JP); Kazuki Iwashita, Ube (JP); Koichi Fukuda, Ube (JP)

(73) Assignee: UBE Industries, Ltd., Yamaguchi (JP)

( * ) Notice: Subject to any disclaimer, the term of this patent is extended or adjusted under 35 U.S.C. 154(b) by 42 days.

(21) Appl. No.: 10/451,261

(22) PCT Filed: Dec. 21, 2001

(86) PCT No.: PCT/JP01/11272

§ 371 (c)(1),
(2), (4) Date: Sep. 17, 2003

(87) PCT Pub. No.: WO02/52724

PCT Pub. Date: Apr. 7, 2002

(65) Prior Publication Data

US 2004/0046621 A1 Mar. 11, 2004

(30) Foreign Application Priority Data

Dec. 22, 2000 (JP) ........................................ 2000-390468

(51) Int. Cl.[7] .............................. H03H 7/46; H03H 7/00
(52) U.S. Cl. ....................................... 333/132; 333/185
(58) Field of Search .......................... 333/23, 132, 166, 333/134, 136, 185, 53, 54, 57; 330/53, 54, 57

(56) References Cited

U.S. PATENT DOCUMENTS 5,021,756 A * 6/1991 Tajima et al. ............... 333/132
2003/0125001 A1 * 7/2003 Kushihi .................... 455/276.1

FOREIGN PATENT DOCUMENTS

| JP | 58-138415 U | 9/1983 | ............ H03H/7/46 |
| JP | 6-90128 A | 3/1994 | ............ H03H/7/46 |
| JP | 6-188622 A | 7/1994 | ............ H01Q/5/00 |
| JP | 10-98348 A | 4/1998 | ............ H03H/7/46 |
| JP | 10-117117 A | 5/1998 | ............ H03H/7/46 |
| JP | 10-200442 A | 7/1998 | ............ H04B/1/40 |
| JP | 11-31905 A | 2/1999 | ........... H01P/1/213 |
| JP | 11-168303 A | 6/1999 | ........... H01P/1/213 |

* cited by examiner

*Primary Examiner*—Dean Takaoka
(74) *Attorney, Agent, or Firm*—Frommer Lawrence & Haug LLP; Ronald R. Santucci

(57) ABSTRACT

Four frequency components (f1 to f4) (where, f1<f2<f3<f4) are input into a port (10) of a first demultiplexing filter circuit (1), and demultiplexed into low frequency components (f1 and f2) and high frequency components (f3 and f4), and input in a port (20) of a second demultiplexing filter circuit (2) and a port (30) of a third demultiplexing filter circuit (3), respectively. The frequency components (f1 and f2) are demultiplexed into the component (f1) and the component (f2) by the second demultiplexing filter circuit (2), and output from a port (23) and a port (24), respectively. The frequency components (f3 and f4) are demultiplexed into the component (f3) and the component (f4) by the third demultiplexing filter circuit (3), and output from a port (33) and a port (34), respectively. The first demultiplexing filter circuit (1) comprises a low-pass filter (11) and a high-pass filter (12), the second demultiplexing filter circuit (2) comprises a low-pass filter (21) and a combined filter (22) of a combination of a low-pass filter and a band elimination filter, and the third demultiplexing filter circuit (3) comprises a combined filter (31) of a combination of a high-pass filter and a band elimination filter and a high-pass filter (32). These demultiplexing filter circuits are formed of a stacked structure.

9 Claims, 10 Drawing Sheets

MULTIPLEXER

This application is a 371 of PCT/JP01/11272 filed on Dec. 21, 2001, published on Jul. 4, 2002 under publication number WO 02/052724 A1 and claims priority benefits of Japanese Patent Application No. 2000-390468 filed Dec. 22, 2000.

TECHNICAL FIELD

The present invention relates to a multiplexer used for a mobile communication device such as a portable terminal of a cellular phone system.

BACKGROUND ART

Popularization of the cellular phone system has been spectacular in recent years, and improvements have been pursued in functions of the portable terminal used in the cellular phone system. As one of such improvements, a cellular phone system has been presented, which uses a dual band portable terminal to enable communications in two frequency bands at one portable terminal. Further, a cellular phone system has been presented, which uses a multifunctional portable terminal based on positioning by a global positioning system (GPS), an addition of a blue tooth (BT) etc. To configure this multifunctional cellular phone system, a function of selecting its four frequency bands becomes necessary. Besides, in order to realize such a function, a compact multiplexer is required for use in the portable terminal. Separation of the four frequency bands can be realized by cascade-connecting three diplexers. FIG. 17 shows a block diagram of such a conventional demultiplexing filter circuit element.

In the demultiplexing filter circuit element of FIG. 17, three demultiplexing filter circuits each constituted of a low-pass filter (LPF) and a high-pass filter (HPF) are connected in series as shown. Frequency pass bands of the demultiplexing filter circuits are different from one another. For example, when RF signals or frequency components (hereinafter, RF signals are carriers and signals in the frequency bands) f1 to f4 (frequency band of f1<frequency band of f2<frequency band of f3<frequency band of f4) included in the respective four frequency bands are input to the first demultiplexing filter circuit, the frequency component f1 is output from an output port of the low-pass filter side, and the remaining RF signals f2 to f4 are output from an output port of the high-pass filter side. The RF signals f2 to f4 are input to the second demultiplexing filter circuit. Here, the RF signal f2 is output from an output port of the low-pass filter side, and the remaining RF signals f3 and f4 are output from an output port of the high-pass filter side. The RF signals f3 and f4 are input to the third demultiplexing filter circuit. Here, the RF signal f3 is output from an output port of the low-pass filter side, and the RF signal f4 is output from an output port of the high-pass filter side.

However, in the aforementioned demultiplexing filter circuit where the three demultiplexing filter circuits are cascade-connected, while the four frequency bands can be separated as described above, there are some problems described below.

First, the RF signals f3 and f4 are passed through the three demultiplexing filter circuits, creating a problem of a large insertion loss in signal. Especially, when weak radio waves are dealt with as in the case of the GPS, it is necessary to reduce insertion losses as much as possible. Thus, a large insertion loss poses a serious problem. In the case of simply using three normal individual demultiplexing filter elements and connecting the elements, element dimensions are increased to interfere with miniaturization. Furthermore, if a plurality of frequency bands are close to one another, there is a problem of insufficient separation of RF signals.

DISCLOSURE OF THE INVENTION

In view of the foregoing, an object of the present invention is to provide a compact and high-performance multiplexer which enables further miniaturization, a reduction of insertion losses and a further improvement of isolation characteristics.

In order to accomplish the above object, according to the present invention, there is provided a multiplexer comprising: a first demultiplexing filter circuit for separating or demultiplexing a frequency band including a first RF signal f1, a second RF signal f2, a third RF signal f3 and a fourth RF signal f4 different from one another (where f1<f2<f3<f4) into a frequency band which includes the f1 and the f2 but neither of the f3 and the f4 practically, and a frequency band which includes the f3 and the f4 but neither of the f1 and the f2 practically; a second demultiplexing filter circuit for separating the frequency band including the f1 and the f2 which is obtained by the separation of the first demultiplexing filter circuit into a frequency band which includes the f1 but none of the f2 to the f4 practically, and a frequency band which includes the f2 but none of the f1, the f3 and the f4 practically; and a third demultiplexing filter circuit for separating the frequency band including the f3 and the f4 which is obtained by the separation of the first demultiplexing filter circuit into a frequency band which includes the f3 but none of the f1, the f2 and the f4 practically, and a frequency band which includes the f4 but none of the f1 to the f3 practically, wherein the second demultiplexing filter circuit comprises a filter of combination of low-pass and band elimination filters or a band pass filter as a filter where the frequency band including the f2 but none of the f1, the f3 and the f4 practically is set to be a pass band, and the third demultiplexing filter circuit comprises a filter of combination of high-pass and band elimination filters or a band pass filter as a filter where the frequency band including the f3 but none of the f1, the f2 and the f4 practically is set to be a pass band.

According to the present invention, "not including the RF signal(s) practically" means that the RF signals are attenuated to required amounts from the standpoint of achieving the separation purpose. It does not necessarily mean complete elimination of the RF signal(s).

In one embodiment of the present invention, the first demultiplexing filter circuit comprises a low-pass filter as a filter where the frequency band including the f1 and the f2 but neither of the f3 and the f4 practically is set to be a pass band, and a high-pass filter as a filter where the frequency band including the f3 and the f4 but neither of the f1 and the f2 practically is set to be a pass band. In another embodiment of the present invention, the second demultiplexing filter circuit comprises a low-pass filter as a filter where the frequency band including the f1 but none of the f2 to the f4 practically is set to be a pass band, and the third demultiplexing filter circuit comprises a high-pass filter as a filter where the frequency band including the f4 but none of the f1 to the f3 practically is set to be a pass band.

In still another embodiment of the present invention, the multiplexer is formed of a laminated or stacked structural body, the laminated structural body is constituted so as to include a plurality of insulating layers and a patterned conductive layer arranged between the insulating layers, each of the first demultiplexing filter circuit, the second demultiplexing filter circuit and the third demultiplexing filter circuit includes an inductance component and a capacitance component, and the inductance component and the capacitance component are formed by using the patterned conductive layer. The insulating layers are made of, for example, ceramics, and the patterned conductive layer is made of, for example, metal.

The multiplexer of the present invention has the combined three demultiplexing filter circuits, and the input of the RF signals f1 to f4 (where f1<f2<f3<f4) belonging to the four frequency bands different from one another is separated into the RF signals f1 and f2 of the lower frequency bands and the RF signals of f3 and f4 of the higher frequency bands by the first demultiplexing filter circuit, the RF signals f1 and f2 of the lower frequency bands output from the first demultiplexing filter circuit are separated into the RF signal f1 and the RF signal f2 by the second demultiplexing filter circuit, and the RF signals f3 and f4 of the higher frequency bands output from the first demultiplexing filter circuit are separated into the RF signal f3 and the RF signal f4 by the third demultiplexing filter circuit. By this structure, the number of stages of cascade-connected demultiplexing filter circuits can be reduced to two, thereby achieving a reduction of insertion losses. Further, the first demultiplexing filter circuit may comprise the low-pass filter and the high-pass filter, the second demultiplexing filter circuit may comprise the low-pass filter for passing the RF signal f1 and the filter of the combination of low-pass and band elimination filters for taking out the RF signal f2, and the third demultiplexing filter circuit may comprise the high-pass filter for passing the RF signal f4 and the filter of the combination of high-pass and band elimination filters for taking out the RF signal f3. Thus, isolation characteristics of each RF signal can be improved, the number of notch circuits can be reduced, and an attenuation load of each demultiplexing filter circuit can be reduced. By forming these demultiplexing filter circuits into one laminated structural body, a compact and high-performance multiplexer which has small insertion losses and improved isolation characteristics is provided.

Further, also by using a band-pass filter in place of the combination filter including the band elimination filter in each of the second demultiplexing filter circuit and the third demultiplexing filter circuit, a high-performance multiplexer having similar effects is provided.

The description of the multiplexer has been made with reference to the case where the mixed RF signal of f1 to f4 is input from the first demultiplexing filter circuit side. However, the multiplexer of the present invention has a function of reversing a signal flow from that of the foregoing, inputting individual RF signals from the second and third demultiplexing filter circuits side, and outputting the mixed RF signal of f1 to f4 from the first demultiplexing filter circuit side.

As the four RF signals, there is an example of a combination of RF signals for a global system for mobile communications (GSM: 800 MHz band) as f1, a global positioning system (GPS: 1.5 GHz band) as f2, a digital communication system (DCS: 1.8 GHz band) as f3, and a blue tooth (BT: 2.4 GHz band) as f4.

BEST MODES FOR CARRYING OUT THE INVENTION

Next, the embodiments of the present invention will be described with reference to the accompanying drawings.

Figure 1:
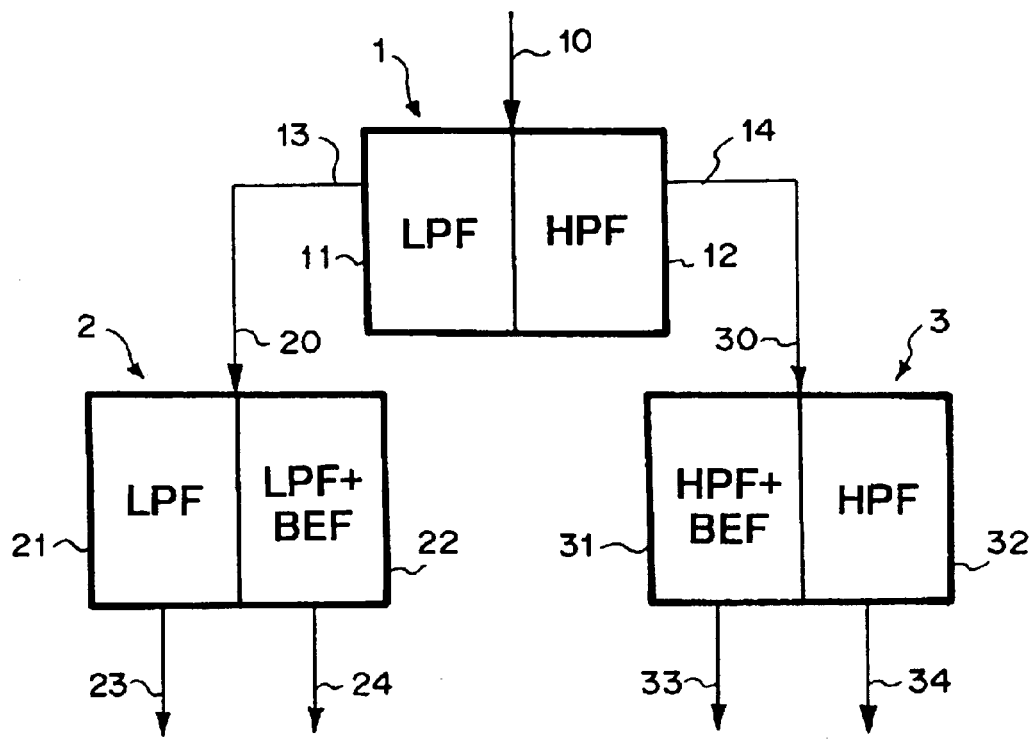
FIG. 1 is a block diagram of a multiplexer of the present invention.

FIG. 1 shows a circuitry block diagram of a first embodiment of the present invention. A multiplexer of the first embodiment comprises a first demultiplexing filter circuit 1, a second demultiplexing filter circuit 2 and a third demultiplexing filter circuit 3, and an input including first to fourth frequency bands different from one another (frequency band of f1<frequency band of f2<frequency band of f3<frequency band of f4) which include the respective first to fourth RF signals or frequency components f1 to f4 different from one another (where f1<f2<f3<f4) is entered to an input/output port 10 of the first demultiplexing filter circuit 1. An output including the frequency band of f1 and the frequency band of f2 is obtained from an input/output port 13 of the first demultiplexing filter circuit 1, which is then input to an input/output port 20 of the second demultiplexing filter circuit 2. On the other hand, an output including the frequency band of f3 and the frequency band of f4 is obtained from an input/output port 14 of the first demultiplexing filter circuit 1, which is then input to an input/output port 30 of the third demultiplexing filter circuit 3. Outputs of the frequency bands of f1, f2 are obtained from the respective input/output ports 23, 24 of the second demultiplexing filter circuit 2, and outputs of the frequency bands of f3, f4 are obtained from the respective input/output ports. 33, 34 of the third demultiplexing filter circuit 3.

The first demultiplexing filter circuit 1 includes a first filter 11 and a second filter 12. The first filter 11 is constituted of a low-pass filter LPF where a band including the f1 and the f2 but neither of the f3 and the f4 practically is a pass band, and the second filter 12 is constituted of a high-pass filter HPF where a band including the f3 and the f4 but neither of the f1 and the f2 practically is a pass band. One input/output port of the first filter 11 and the second filter 12 is set as a common port 10.

The second demultiplexing filter circuit 2 includes a third filter 21 and a fourth filter 22. The third filter 21 is constituted of a low-pass filter LPF where a band including the f1 but none of the f2 to the f4 practically is a pass band, and the fourth filter 22 is a filter where a band including the f2 but none of the f1, the f3 and the f4 practically is a pass band, and constituted of a filter of combination of a low-pass filter LPF and a band elimination filter BEF. One input/output port of the third filter 21 and the fourth filter 22 is set as a common port 20. The common port 20 is connected to an input/output port 13 of the first filter 11 which is not a common port.

The third demultiplexing filter circuit 3 includes a fifth filter 31 and a sixth filter 32. The fifth filter 31 is a filter where a band including the f3 but none of the f1, the f2 and the f4 practically is a pass band, and constituted of a filter of combination of a high-pass filter HPF and a band elimination filter BEF, and the sixth filter 32 is constituted of a high-pass filter HPF where a band including the f4 but none of the f1 to the f3 practically is a pass band. One input/output port of the fifth filter 31 and the sixth filter 32 is set as a common port 30. The common port 30 is connected to an input/output port 14 of the second filter 12 which is not a common port.

Figure 2:
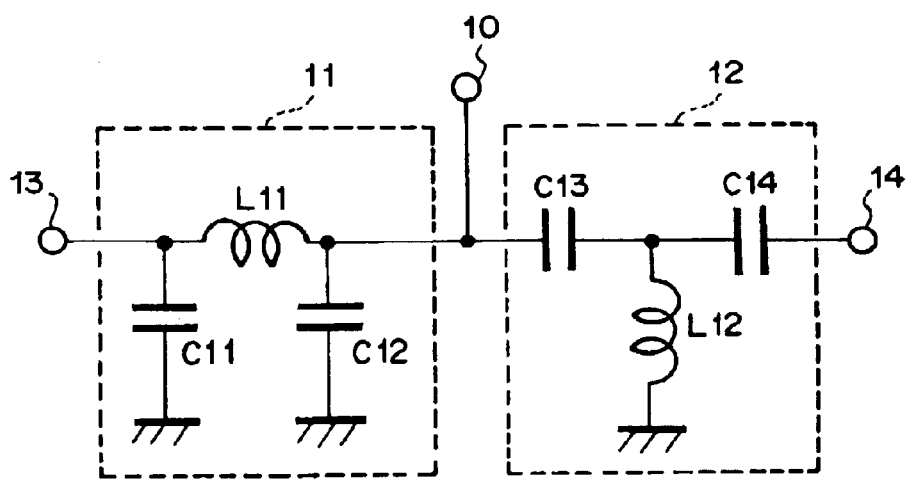
FIG. 2 is a constitutional diagram of a first demultiplexing filter circuit in the multiplexer of FIG. 1.

FIG. 2 shows a constitutional diagram of the first demultiplexing filter circuit 1. The first demultiplexing filter circuit 1 comprises a low-pass filter 11 including an inductance component L11 and capacitance components C11, C12, and a high-pass filter 12 including an inductance component L12 and capacitance components C13, C14. For the RF signals f1 to f4 input from the common port 10, the low-pass filter 11 operates to output only the RF signals f1 and f2 of the lower frequency bands to the input/output port 13 of the low-pass filter 11, and the high-pass filter 12 operates to output only the RF signals f3 and f4 of the higher frequency bands to the input/output port 14 of the high-pass filter 12.

Figure 3:
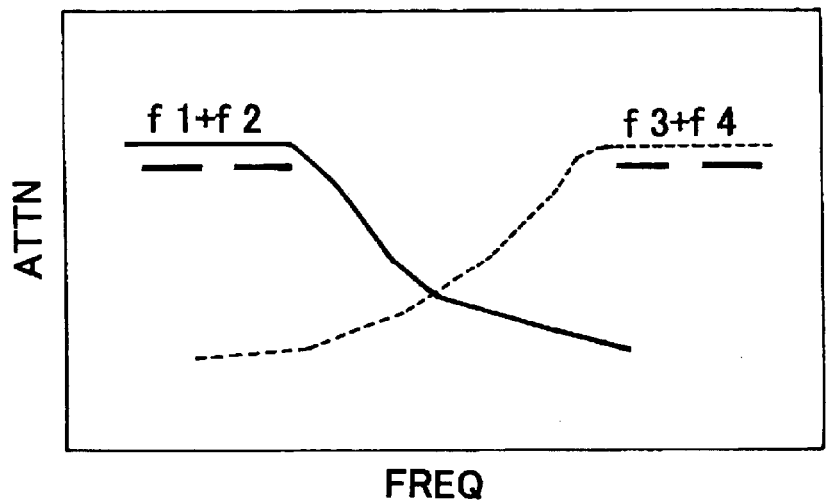
FIG. 3 is a diagram showing frequency characteristics of the first demultiplexing filter circuit in the multiplexer of FIG. 1.

FIG. 3 is a frequency characteristic diagram of the first demultiplexing filter circuit 1, especially the low-pass filter 11 and the high-pass filter 12 constituting the circuit. Here, a change of an attenuation amount ATTN with respect to a frequency FREQ is shown.

Figure 4:
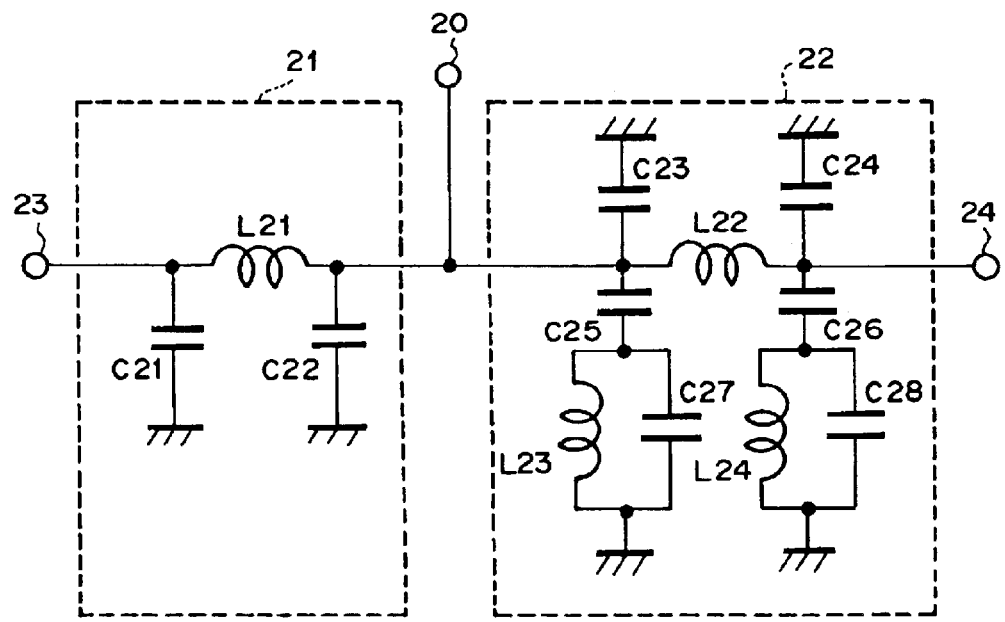
FIG. 4 is a constitutional diagram of a second demultiplexing filter circuit in the multiplexer of FIG. 1.

FIG. 4 shows a constitutional diagram of the second demultiplexing filter circuit 2. The second demultiplexing filter circuit 2 comprises a low-pass filter 21 including an inductance component L21 and capacitance components C21, C22, and a filter 22 of combination of low-pass and band elimination filters including inductance components L22, L23, L24 and capacitance components C23, C24, C25, C26, C27, C28. For the RF signals f1, f2 input from the common port 20, the low-pass filter 21 operates to output only the RF signal f1 to the input/output port 23 of the low-pass filter 21, and the filter 22 of the combination of low-pass and band elimination filters operates to output only the RF signal f2 to the input/output port 24 of the combined filter 22.

Figure 5:
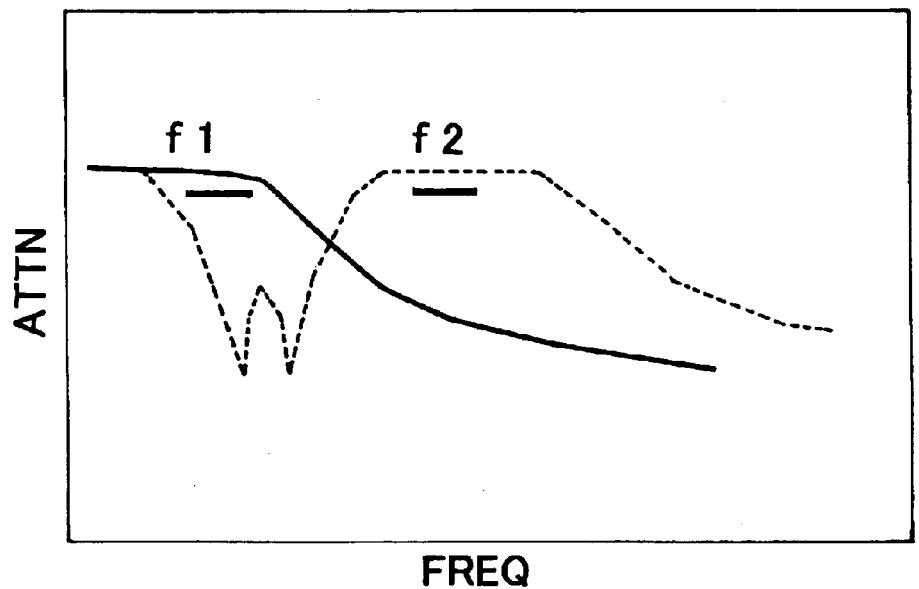
FIG. 5 is a diagram showing frequency characteristics of the second demultiplexing filter circuit in the multiplexer of FIG. 1.

FIG. 5 is a frequency characteristic diagram of the second demultiplexing filter circuit 2, especially the low-pass filter 21 and the combination filter 22 constituting the circuit. Here, a change of an attenuation amount ATTN with respect to a frequency FREQ is shown. In the filter 22 of the combination of low-pass and band elimination filters, a non-pass band is formed in the band including the RF signal f1, and the RF signal f1 is eliminated nearly completely to take out only the RF signal f2. In the combination filter 22, in a side of a frequency higher than the RF signal f2, attenuation characteristics by the low-pass filter of the combination filter 22 are doubly applied in addition to attenuation characteristics by the low-pass filter 11 of the first demultiplexing filter circuit 1. Thus, separation characteristics of the RF signal f2 are good. Especially, in a place where a weak radio wave of a GPS or the like is conceivable as the RF signal f2, in the case of passing and taking out such a weak radio wave, other RF signals must be eliminated as completely as possible, and a loss during passage is preferably small. Thus, the aforementioned constitution of the second demultiplexing filter circuit 2 is best suited for separation of the weak radio wave of the GPS or the like.

Figure 6:
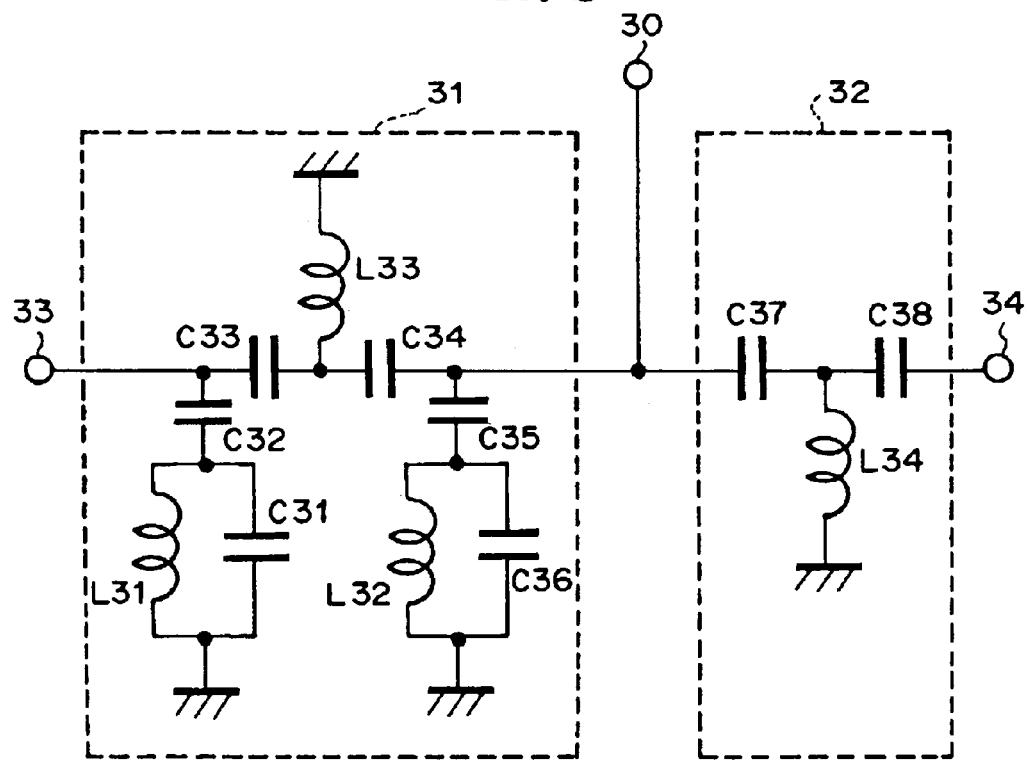
FIG. 6 is a constitutional diagram of a third demultiplexing filter circuit in the multiplexer of FIG. 1.

FIG. 6 shows a constitutional diagram of the third demultiplexing filter circuit 3. The third demultiplexing filter circuit 3 comprises a filter 31 of combination of high-pass and band elimination filters including inductance components L31, L32, L33 and capacitance components C31, C32, C33, C34, C35, C36, and a high-pass filter 32 including an inductance component L34 and capacitance components C37, C38. For the RF signals f3, f4 input from the common port 30., the filter 31 of the combination of high-pass and band elimination filters operates to output only the RF signal f3 to the input/output port 33 of the combination filter 31, and the high-pass filter 32 operates to output only the RF signal f4 to the input/output port 34 of the high-pass filter 32.

Figure 7:
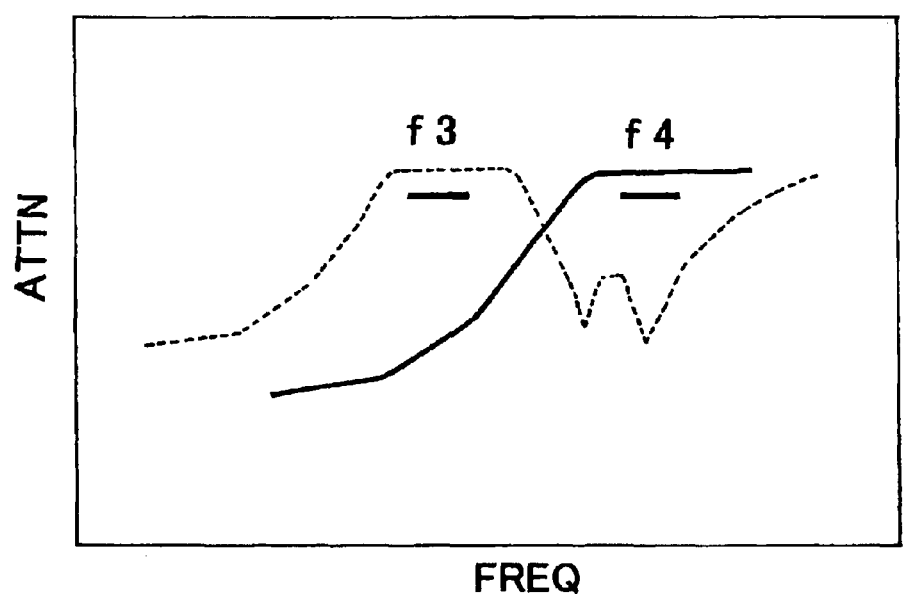
FIG. 7 is a diagram showing frequency characteristics of the third demultiplexing filter circuit in the multiplexer of FIG. 1.

FIG. 7 is a frequency characteristic diagram of the third demultiplexing filter circuit 3, especially the combination filter 31 and the high-pass filter 32 constituting the circuit. Here, a change of an attenuation amount ATTN with respect to a frequency FREQ is shown. In the filter 31 of the combination of high-pass and band elimination filters, a non-pass band is formed in the band including the RF signal f4, and the RF signal f4 is eliminated nearly completely to take out only the RF signal f3. In the combination filter 31, in a side of a frequency lower than the RF signal f3, attenuation characteristics by the high-pass filter of the combination filter 31 are doubly applied in addition to attenuation characteristics by the high-pass filter 12 of the first demultiplexing filter circuit 1. Thus, separation characteristics of the RF signal f3 are good. Especially, in the case of passing and taking out a weak radio wave, other RF signals must be eliminated as completely as possible, and a loss during passage is preferably small. Thus, the aforementioned constitution of the third demultiplexing filter circuit 3 is best suited for separation of a weak radio wave used as the RF signal f3.

The aforementioned multiplexer of the first embodiment is preferably formed in a laminated or stacked structural body. That is, preferably, the inductance components L11, L12, L21 to L24, L31 to 34 and the capacitance components C11 to C14, C21 to 28, C31 to 38 of the first demultiplexing filter circuit 1, the second demultiplexing filter circuit 2 and the third demultiplexing filter circuit 3 are formed by using patterned conductive layers constituting the laminated structural body.

Figure 8:
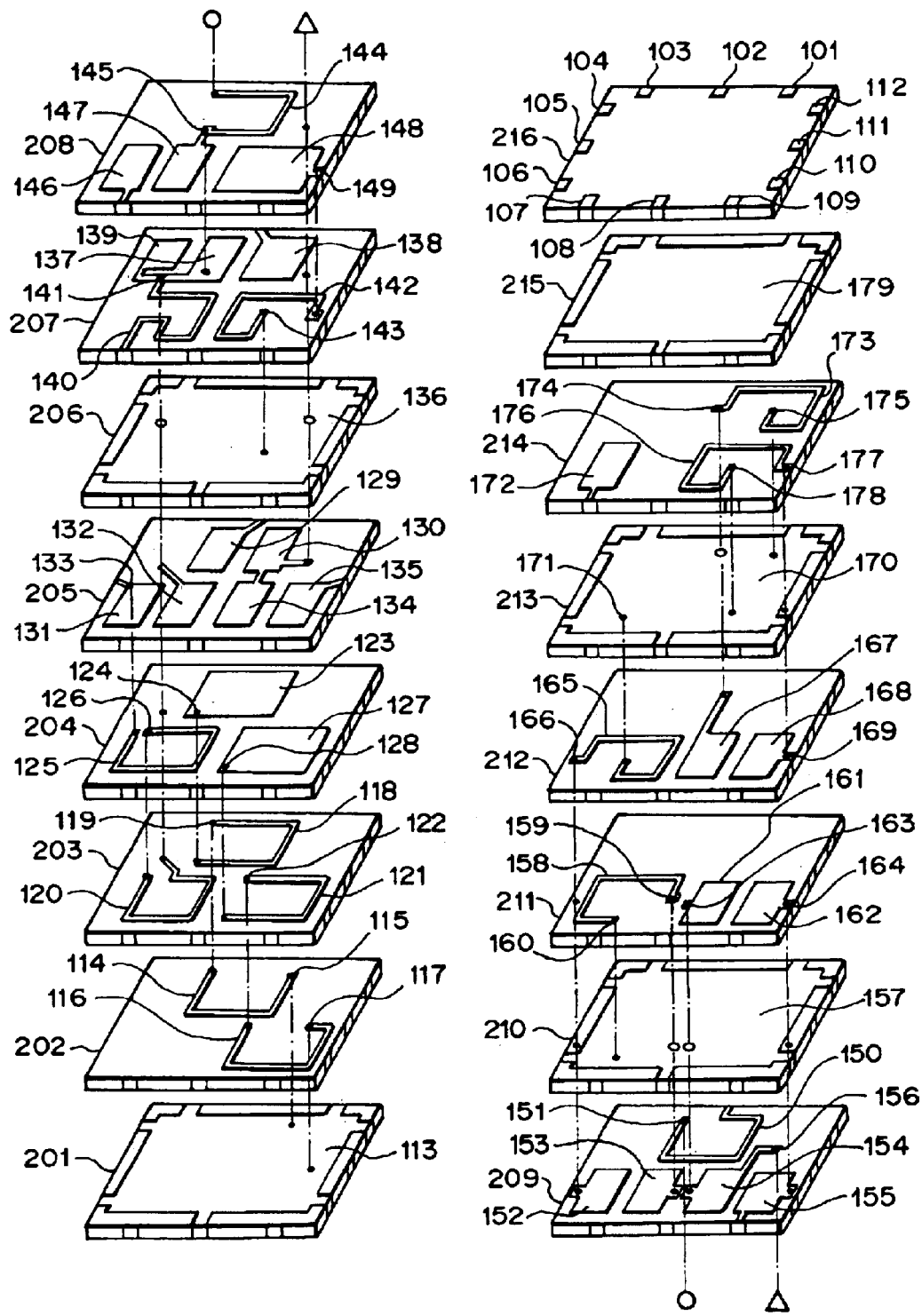
FIG. 8 is an exploded perspective view showing a laminated or stacked structure of the multiplexer of FIG. 1.
Figure 9:
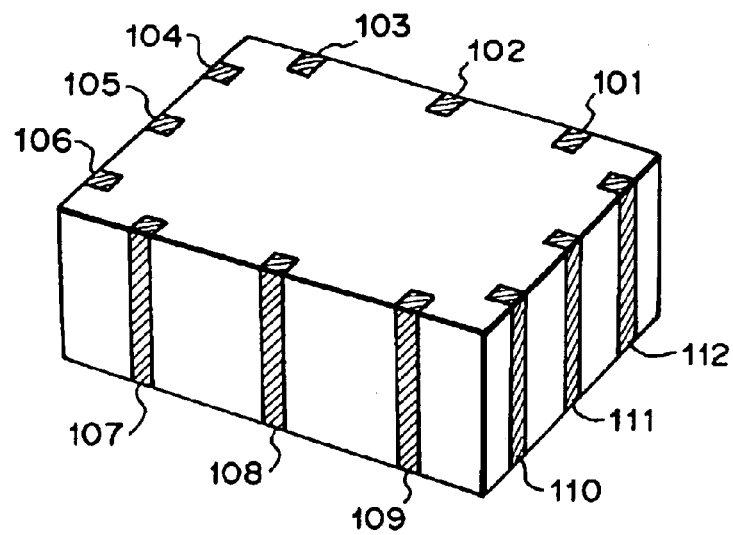
FIG. 9 is a perspective view of a laminated structural body of the multiplexer of FIG. 1.

A perspective view of such a laminated structural body is shown in FIG. 9, and an exploded perspective view thereof is shown in FIG. 8. The laminated structural body has external ground (GND) terminals 101, 103, 104, 106, 108, 110, 112, an external input terminal 102, and external output terminals 105, 107, 109, 111, which are formed of the patterned conductive layers.

This laminated structural body can be prepared by using a sheet laminating method described below.

First, a ceramic green sheet is prepared. As the ceramic green sheet, a ceramic dielectric material which can be baked at a low temperature of 950° C. or lower is preferable. For example, a material having a dielectric constant of 5 to 70, esp. about 10, is used. A predetermined number of such ceramic green sheets are laminated. On each ceramic green sheet, through-holes are formed in required positions when needed, and patterns (including a pattern by a conductor of silver (Ag) paste or the like filling the through-holes) are formed on a surface by using a screen printing method to apply a metal paste such as Ag paste or the like. The laminated body of the ceramic green sheets is baked integrally at about 900° C., and a conductive film (electrode) for the external GND terminal, a conductive film (electrode) for the external input terminal, and a conductive film (electrode) for the external output terminal are formed on a top surface, a bottom surface and a side face thereof, whereby a laminated structural body including an insulating layer made of a ceramic dielectric material and a patterned conductive layer (may be referred to as "electrode", hereinafter) made of a conductor such as Ag or the like is obtained.

A thickness of the insulating layer is, for example, 0.02 to 0.3 mm, and a thickness of the patterned conductive layer is, for example 0.005 to 0.02 mm. A dimension of the laminated structural body is, for example, 45 mm long×32 $\mu$mm wide×20 mm thick.

In FIG. 8, reference numerals 201 to 216 denote rectangular insulating layers, reference numerals 113, 136, 157, 170, 179 denote earth electrodes (patterned conductive layers for earths connected to the external GND terminals), and these earth electrodes have drawer parts connected to the external GND terminals 101, 103, 104, 106, 108, 110, 112. Reference numerals 114, 116, 118, 120, 121, 125, 140, 142, 144, 150, 158, 165, 173, 176 denote coil electrodes (patterned conductive layers for forming the inductance components), and reference numerals 123, 127, 129 to 132, 134, 135, 137 to 139, 146 to 148, 152 to 155, 161, 162, 167, 168, 172 denote capacitance electrodes (patterned conductive layers for forming the capacitance components). Reference numerals 115, 117, 119, 122, 124, 126, 128, 133, 141, 143, 145, 149, 151, 156, 159, 160, 163, 164, 166, 169, 171, 174, 175, 177, 178 denote conductive layers filling the through-holes, and these conductive layers connect a plurality among the earth electrodes, the coil electrodes and the capacitance electrodes.

Hereinafter, a constitution of the laminated structural body shown in FIG. 8 will be described corresponding to the constitutions of the demultiplexing filter circuits 1, 2, 3 shown in FIGS. 2, 4 and 6.

Regarding the low-pass filter 11 of FIG. 2, the capacitance component C11 comprises the capacitance electrode 137 and the earth electrode 136. The capacitance component C12 comprises the capacitance electrode 138 and the earth electrode 136. One end of the capacitance electrode 138 is connected to the external input terminal 102. The inductance component L11 comprises the coil electrode 144, the throughhole 151 and the coil electrode 150. One end of the coil electrode 150 is connected to the external input terminal 102.

Regarding the high-pass filter 12 of FIG. 2, the capacitance component C13 comprises the capacitance electrode 129 and the capacitance electrode 123. One end of the capacitance electrode 129 is connected to the external input terminal 102. The capacitance component C14 comprises the capacitance electrode 130 and the capacitance electrode 123. The inductance component L12 comprises the through-hole 124, the coil electrode 118, the through-hole 119, the coil electrode 114 and the through-hole 115.

Regarding the low-pass filter 21 of FIG. 4, the capacitance component C21 comprises the capacitance electrode 131 and the earth electrode 136. One end of the capacitance electrode 131 is connected to the external output terminal 105. The capacitance component C22 comprises the capacitance electrode 132 and the earth electrode 136. The inductance component L21 comprises the through-hole 141, the coil electrode 120, the through-hole 126, the coil electrode 125 and the through-hole 133.

Regarding the filter 22 of the combination of low-pass and band elimination filters of FIG. 4, the capacitance component C23 comprises the capacitance electrode 139 and the earth electrode 136. The capacitance component C24 comprises the capacitance electrode 172 and the earth electrode 170. One end of the capacitance electrode 172 is connected to the external output terminal 107. The inductance component L22 comprises the coil electrode 140. One end of the coil electrode 140 is connected to the external output terminal 107. The capacitance component C25 comprises the capacitance electrode 147 and the capacitance electrode 153. The capacitance component C27 comprises the capacitance electrode 153 and the earth electrode 157. The inductance component L23 comprises the through-hole 159, the coil electrode 158 and the through-hole 160. The capacitance component C26 comprises the capacitance electrode 146 and the capacitance electrode 152. One end of the capacitance electrode 146 is connected to the external output terminal 107. The capacitance component C28 comprises the capacitance electrode 152 and the earth electrode 157. The inductance component L24 comprises the through-hole 166, the coil electrode 165 and the through-hole 171.

Regarding the filter 31 of the combination of high-pass and band elimination filters of FIG. 6, the capacitance component C33 comprises the capacitance electrode 155 and the capacitance electrode 148. One end of the capacitance electrode 155 is connected to the external output terminal 109. The inductance component L33 comprises the through-hole 149, the coil electrode 142, and the through-hole 143. The capacitance component C34 comprises the capacitance electrode 154 and the capacitance electrode 148. The capacitance component C32 comprises the capacitance electrode 162 and the capacitance electrode 168. The capacitance component C31 comprises the capacitance electrode 168 and the earth electrode 170. The inductance component L31 comprises the through-hole 177, the coil electrode 176 and the throughhole 178. The capacitance component C35 comprises the capacitance electrode 161 and the capacitance electrode 167. The capacitance component C36 comprises the capacitance electrode 167 and the earth electrode 170. The inductance component L32 comprises the through-hole 174, the coil electrode 173 and the through-hole 175.

Regarding the high-pass filter 32 of FIG. 6, the capacitance component C37 comprises the capacitance electrode 134 and the capacitance electrode 127. The inductance component L34 comprises the through-hole 128, the coil electrode 121, the through-hole 122, the coil electrode 116 and the through-hole 117. The capacitance component C38 comprises the capacitance electrode 135 and the capacitance electrode 127. One end of the capacitance electrode 135 is connected to the external output terminal 111.

As described above, according to the first embodiment, it is possible to obtain the high-performance multiplexer where insertion losses are small, isolation characteristics are improved more, and the four RF signals are separated into the respective components. Moreover, according to the embodiment, the form of the laminated structural body enables sufficient miniaturization.

Next, description will be made of a multiplexer which uses band pass filters in place of the band elimination filters used in the second demultiplexing filter circuit 2 and the third demultiplexing filter circuit 3 in the circuitry of the first embodiment as a second embodiment.

Figure 10:
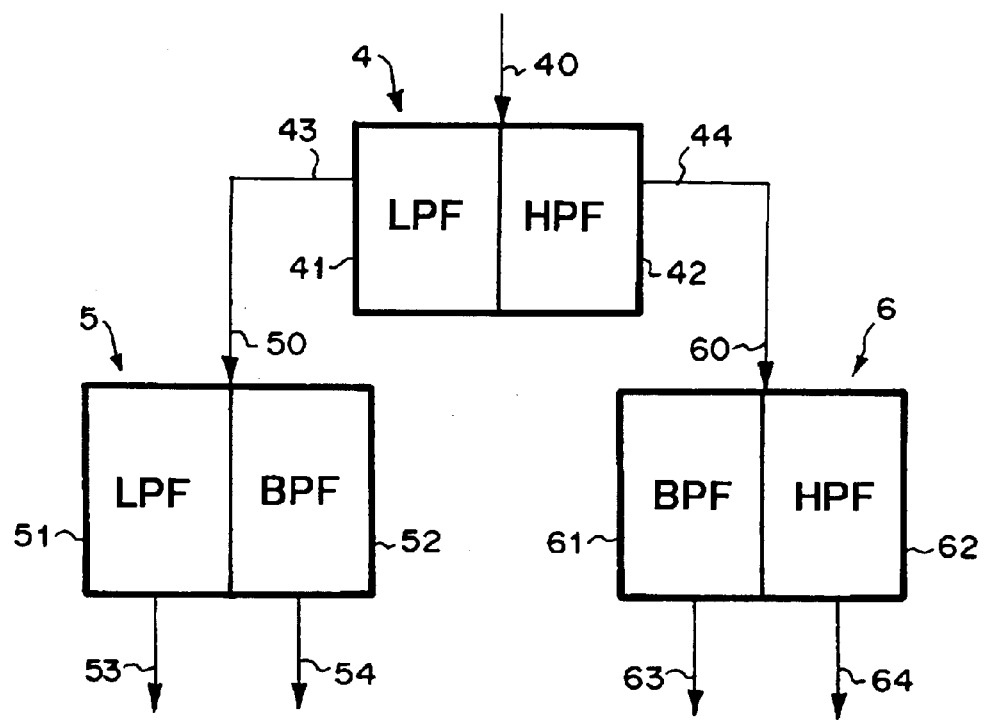
FIG. 10 is a block diagram of a multiplexer of the present invention.

FIG. 10 shows a circuitry block diagram of the second embodiment. The multiplexer of the second embodiment comprises a first demultiplexing filter circuit 4, a second demultiplexing filter circuit 5 and a third demultiplexing filter circuit 6. As in the case of the first embodiment, an input including first to fourth frequency bands different from one another which include the respective first to fourth RF signals f1 to f4 different from one another is entered to an input/output port 40 of the first demultiplexing filter circuit 4. An output including the frequency band of f1 and the frequency band of f2 is obtained from an input/output port 43 of the first demultiplexing filter circuit 4, which is then input to an input/output port 50 of the second demultiplexing filter circuit 5. On the other hand, an output including the frequency band of f3 and the frequency band of f4 is obtained from an input/output port 44 of the first demultiplexing filter circuit 4, which is then input to an input/output port 60 of the third demultiplexing filter circuit 6. Outputs of the frequency bands of f1, f2 are obtained from the respective input/output ports 53, 54 of the second demultiplexing filter circuit 5, and outputs of the frequency bands of f3, f4 are obtained from the respective input/output ports 63, 64 of the third demultiplexing filter circuit 6.

The first demultiplexing filter circuit 4 includes a first filter 41 and a second filter 42. The first filter 41 is constituted of a low-pass filter LPF where a band including the f1 and the f2 but neither of the f3 and the f4 practically is a pass band, and the second filter 42 is constituted of a high-pass filter HPF where a band including the f3 and the f4 but neither of the f1 and the f2 practically is a pass band. One input/output port of the first filter 41 and the second filter 42 is set as a common port 40. A constitution of this first demultiplexing filter circuit 4 is similar to that of the first demultiplexing filter circuit 1 of the first embodiment.

The second demultiplexing filter circuit 5 includes a third filter 51 and a fourth filter 52. The third filter 51 is constituted of a low-pass filter LPF where a band including the f1 but none of the f2 to the f4 practically is a pass band, and the fourth filter 52 is a filter where a band including the f2 but none of the f1, the f3 and the f4 practically is a pass band, and constituted of a band pass filter BPF. One input/output port of the third filter 51 and the fourth filter 52 is set as a common port 50. The common port 50 is connected to an input/output port 43 of the first filter 41 which is not a common port.

The third demultiplexing filter circuit 6 includes a fifth filter 61 and a sixth filter 62. The fifth filter 61 is a filter where a band including the f3 but none of the f1, the f2 and the f4 practically is a pass band, and constituted of a band pass filter BPF, and the sixth filter 62 is constituted of a high-pass filter HPF where a band including the f4 but none of the f1 to the f3 practically is a pass band. One input/output port of the fifth filter 61 and the sixth filter 62 is set as a common port 60. The common port 60 is connected to an input/output port 44 of the second filter 42 which is not a common port.

Figure 11:
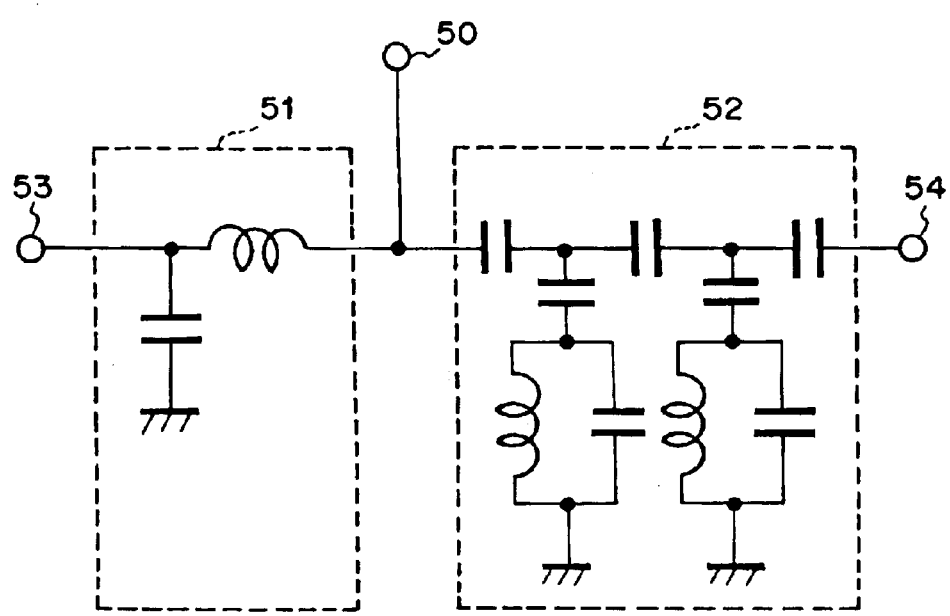
FIG. 11 is a constitutional diagram of a second demultiplexing filter circuit in the multiplexer of FIG. 10.

FIG. 11 shows a constitutional diagram of the second demultiplexing filter circuit 5. The second demultiplexing filter circuit 5 comprises a low-pass filter 51 including an inductance component and a capacitance component, and a band pass filter 52 including an inductance component and a capacitance component. For the RF signals f1, f2 input from the common port 50, the low-pass filter 51 operates to output only the RF signal f1 to the input/output port 53 of the low-pass filter 51, and the band pass filter 52 operates to output only the RF signal f2 to the input/output port 54 of the band pass filter 52.

Figure 12:
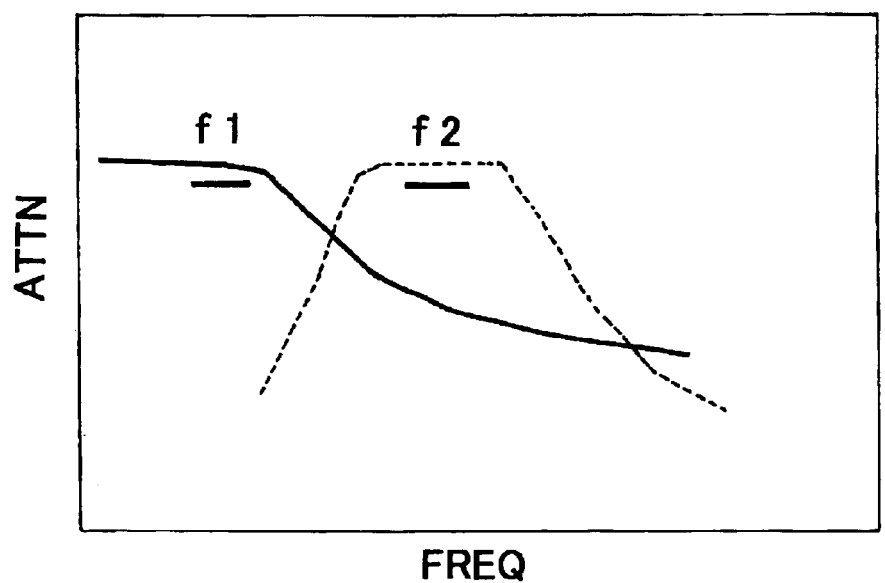
FIG. 12 is a diagram showing frequency characteristics of the second demultiplexing filter circuit in the multiplexer of FIG. 10.

FIG. 12 is a frequency characteristic diagram of the second demultiplexing filter circuit 5, especially the low-pass filter 51 and the band pass filter 52 constituting the circuit. Here, a change of an attenuation amount ATTN with respect to a frequency FREQ is shown. In the band pass filter 52, the RF signal f1 is separated and eliminated to take out only the RF signal f2. In the band pass filter 52, in a side of a frequency higher than the RF signal f2, attenuation characteristics by the band pass filter 52 are doubly applied in addition to attenuation characteristics by the low-pass filter 41 of the first demultiplexing filter circuit 4. Thus, separation characteristics of the RF signal f2 are good. Especially, in a place where a weak radio wave of a GPS or the like is conceivable as the RF signal f2, in the case of passing and taking out such a weak radio wave, other RF signals must be eliminated as completely as possible, and a loss during passage is preferably small. Thus, the aforementioned constitution of the second demultiplexing filter circuit 5 is best suited for separation of the weak radio wave of the GPS or the like.

Figure 13:
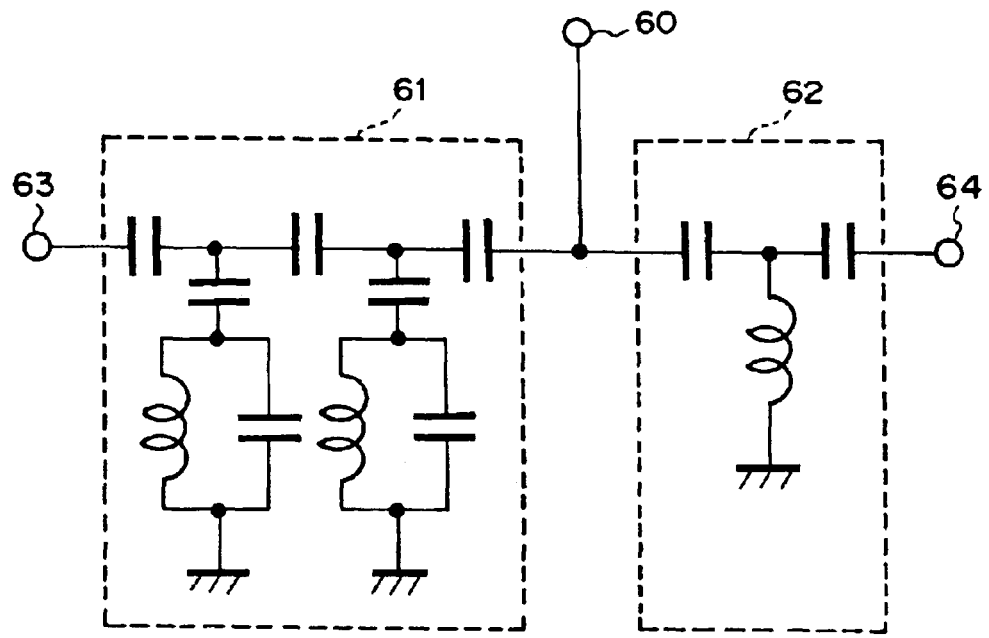
FIG. 13 is a constitutional diagram of a third demultiplexing filter circuit in the multiplexer of FIG. 10.

FIG. 13 shows a constitutional diagram of the third demultiplexing filter circuit 6. The third demultiplexing filter circuit 6 comprises a band pass filter 61 including an inductance component and a capacitance component, and a high-pass filter 62 including an inductance component and a capacitance component. For the RF signals f3, f4 input from the common port 60, the band pass filter 61 operates to output only the RF signal f3 to the input/output port 63 of the band pass filter 61, and the high-pass filter 62 operates to output only the RF signal f4 to the input/output port 64 of the high-pass filter 62.

Figure 14:
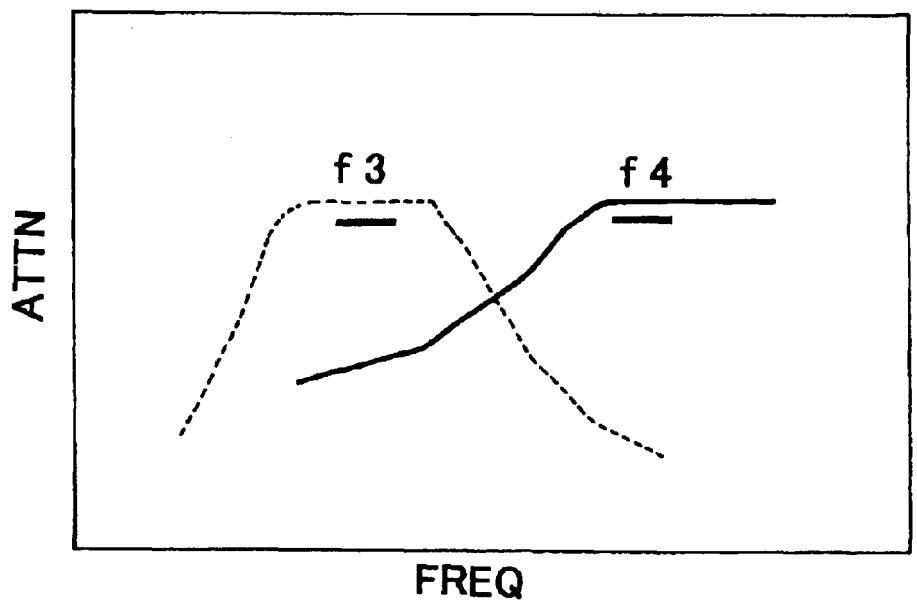
FIG. 14 is a diagram showing frequency characteristics of the third demultiplexing filter circuit in the multiplexer of FIG. 10.

FIG. 14 is a frequency characteristic diagram of the third demultiplexing filter circuit 6, especially the band pass filter 61 and the high-pass filter 62 constituting the circuit. Here, a change of an attenuation amount ATTN with respect to a frequency FREQ is shown. In the band pass filter 61, the RF signal f4 is separated and eliminated to take out only the RF signal f3. In the band pass filter 61, in a side of a frequency lower than the RF signal f3, attenuation characteristics by the band pass filter 61 are doubly applied in addition to attenuation characteristics by the high-pass filter 42 of the first demultiplexing filter circuit 4. Thus, separation characteristics of the RF signal f3 are good. Especially, in the case of passing and taking out a weak radio wave, other RF signals must be eliminated as completely as possible, and a loss during passage is preferably small. Thus, the aforementioned constitution of the third demultiplexing filter circuit 6 is best suited for separation of a weak radio wave used as the RF signal f3.

The aforementioned multiplexer of the second embodiment is preferably formed in a laminated structural body as in the case of the first embodiment. That is, preferably, the inductance components and the capacitance components of the first demultiplexing filter circuit 4, the second demultiplexing filter circuit 5 and the third demultiplexing filter circuit 6 are formed by using patterned conductive layers constituting the laminated structural body.

Figure 15:
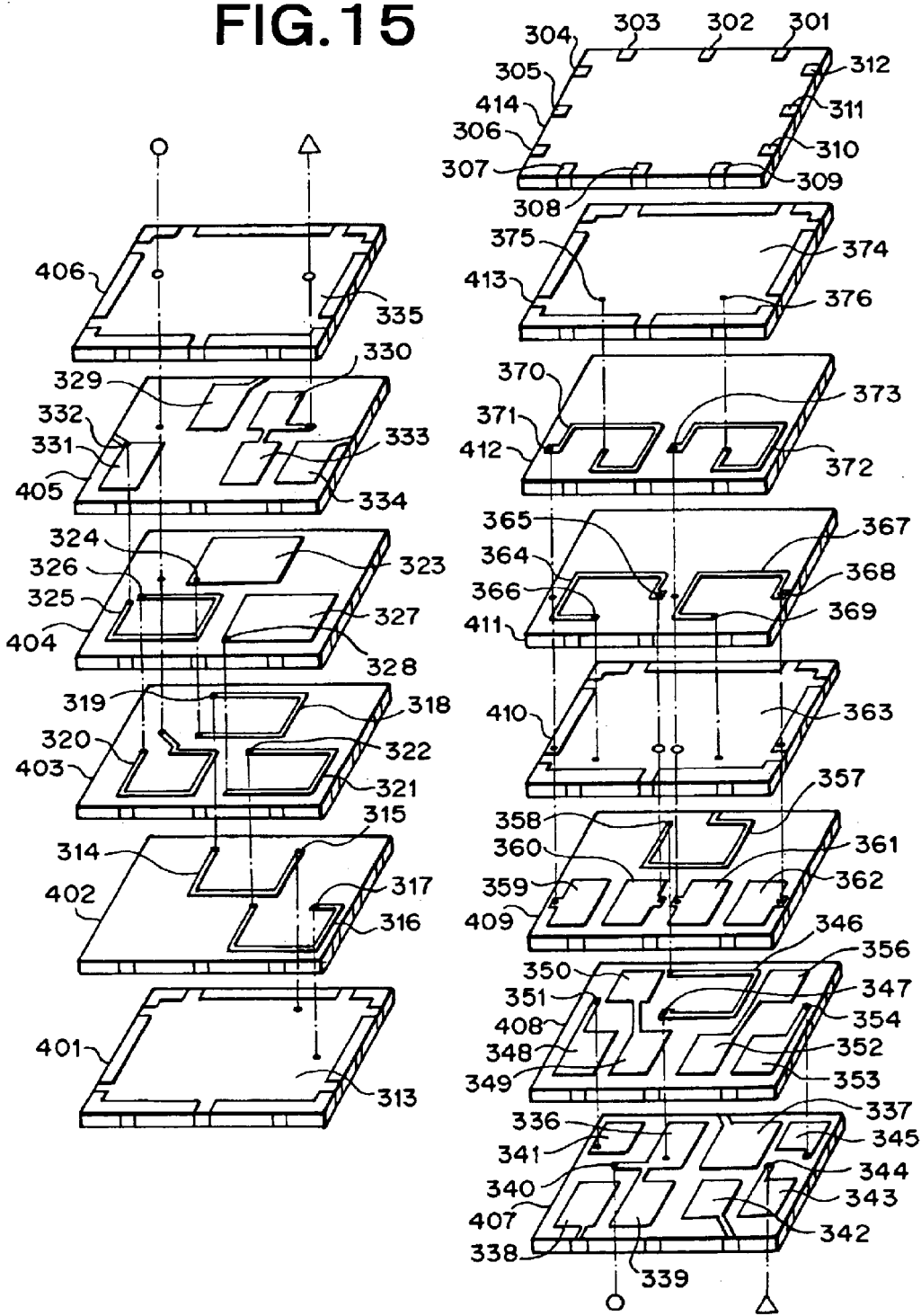
FIG. 15 is an exploded perspective view showing a laminated structure of the multiplexer of FIG. 10.
Figure 16:
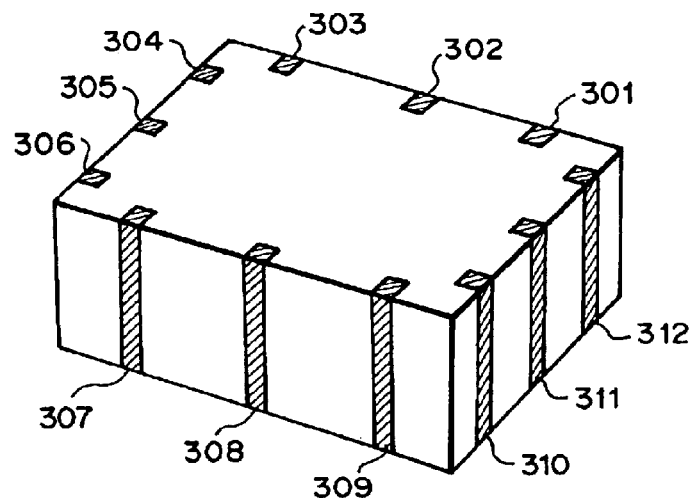
FIG. 16 is a perspective view of a laminated structural body of the multiplexer of FIG. 10.
Figure 17:
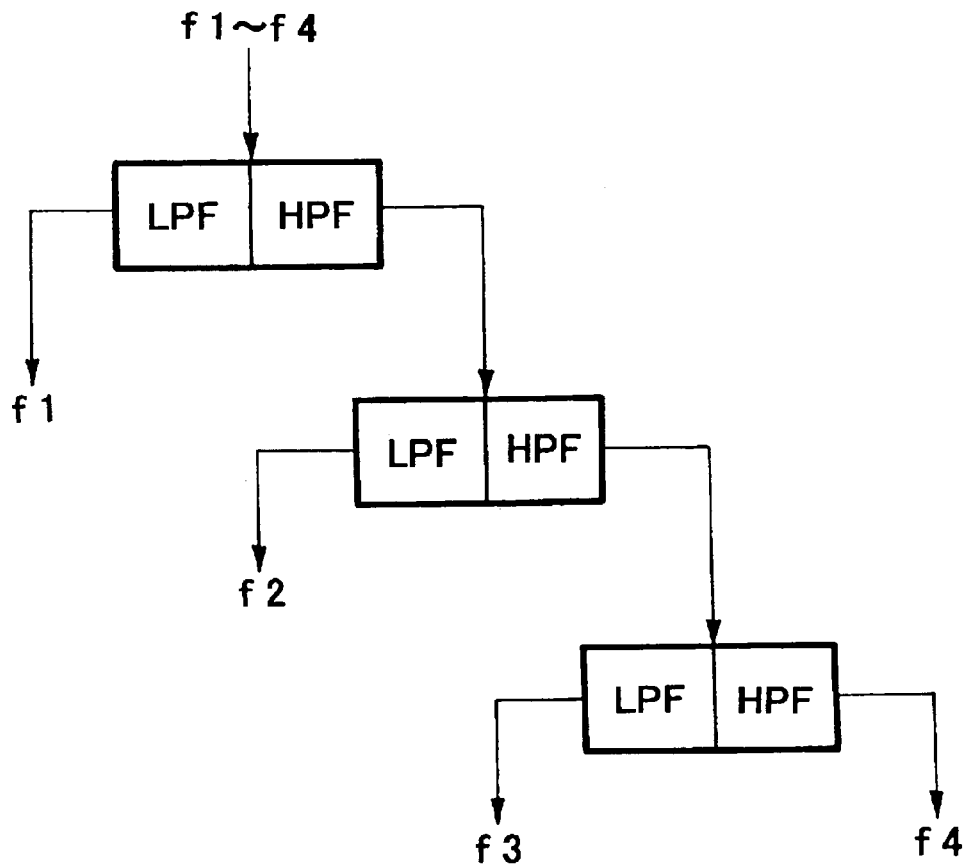
FIG. 17 is a block diagram of a conventional demultiplexing filter circuit element.

A perspective view of such a laminated structural body is shown in FIG. 16, and an exploded perspective view thereof is shown in FIG. 15. The laminated structural body has external ground (GND) terminals 301, 303, 304, 306, 308, 310, 312, an external input terminal 302, and external output terminals 305, 307, 309, 311, which are formed of the patterned conductive layers. A manufacturing method of this laminated structural body is similar to that described above with reference to the first equipment, and thus description thereof will be omitted.

In FIG. 15, reference numerals 401 to 414 denote rectangular insulating layers, reference numerals 313, 335, 363, 374 denote earth electrodes, and these earth electrodes have drawer parts connected to the external GND terminals 301, 303, 304, 306, 308, 310, 312. Reference numerals 314, 316, 318, 320, 321, 325, 346, 357, 364, 367, 370, 372 denote coil electrodes (patterned conductive layers for forming the inductance components), and reference numerals 323, 327, 329 to 331, 333, 334, 336 to 339, 341 to 343, 345, 348 to 350, 352, 353, 356, 359 to 362 denote capacitance electrodes (patterned conductive layers for forming the capacitance components). Reference numerals 315, 317, 319, 322, 324, 326, 328, 332, 340, 344, 347, 351, 354, 358, 365, 366, 368, 369, 371, 373, 375, 376 denote conductive layers filling the through-holes, and these conductive layers connect a plurality among the earth electrodes, the coil electrodes and the capacitance electrodes.

Though not described in detail here, a proper combination of the earth electrodes, the coil electrodes, the capacitance electrodes and the conductive layers in the through-holes enables formation of inductance components, capacitance components and connections thereof.

As described above, also according to the second embodiment, it is possible to obtain the high-performance multiplexer where sufficient miniaturization is possible, insertion losses are small, isolation characteristics are improved more, and the four RF signals are separated into the respective components.

In the second embodiment, the band pass filters are used in place of both of the combination filters including the band elimination filters used in the second demultiplexing filter circuit 2 and the third demultiplexing filter circuit 3 of the circuitry of the first embodiment. However, according to the present invention, the band pass filter may be used in place of only one of the combined filters including the band elimination filters used in the second demultiplexing filter circuit 2 and the third demultiplexing filter circuit 3 of the circuitry of the first embodiment. Also by this way, it is possible to obtain effects similar to those of the first embodiment and the second embodiment.

INDUSTRIAL APPLICABILITY

As described above, according to the present invention, the multiplexer for separating signals belonging to the four frequency bands including a weak radio wave of the GPS or the like well can be constituted of a simple circuit, and an insertion loss of the weak radio wave of the GPS or the like can be reduced to improve a degree of separation from other radio waves. Moreover, by constituting the circuit of a laminated structure, it is possible to provide the multiplexer which is compact and excellent in separation performance.

What is claimed is:

1. A multiplexer comprising:
a first demultiplexing filter circuit for separating a frequency band including a first RF signal f1, a second RF signal f2, a third RF signal f3 and a fourth RF signal f4 different from one another (where f1<f2<f3<f4) into a frequency band which includes the f1 and the f2 but neither of the f3 and the f4 practically, and a frequency band which includes the f3 and the f4 but neither of the f1 and the f2 practically;
a second demultiplexing filter circuit for separating the frequency band including the f1 and the f2 which is obtained by the separation of the first demultiplexing filter circuit into a frequency band which includes the f1 but none of the f2 to the f4 practically, and a frequency band which includes the f2 but none of the f1, the f3 and the f4 practically; and
a third demultiplexing filter circuit for separating the frequency band including the f3 and the f4 which is obtained by the separation of the first demultiplexing filter circuit into a frequency band which includes the f3 but none of the f1, the f2 and the f4 practically, and a frequency band which includes the f4 but none of the f1 to the f3 practically, wherein the second demultiplexing filter circuit comprises a filter of combination of low-pass and band elimination filters or a band pass filter as a filter where the frequency band including the f2 but none of the f1, the f3 and the f4 practically is set to be a pass band, and the third demultiplexing filter circuit comprises a filter of combination of high-pass and band elimination filters or a band pass filter as a filter where the frequency band including the f3 but none of the f1, the f2 and the f4 practically is set to be a pass band,
wherein the second demultiplexing filter circuit comprises a low-pass filter as a filter where the frequency band including the f1 but none of the f2 to the f4 practically is set to be a pass band, and the third demultiplexing filter circuit comprises a high-pass filter as a filter where the frequency band including the f4 but none of the f1 to the f3 practically is set to be a pass band.

2. The multiplexer according to claim 1,
wherein the multiplexer is formed of a laminated structural body, the laminated structural body is constituted so as to include a plurality of insulating layers and a patterned conductive layer arranged between the insulating layers, each of the first demultiplexing filter circuit, the second demultiplexing filter circuit and the third demultiplexing filter circuit includes an inductance component and a capacitance component, and the inductance component and the capacitance component are formed by using the patterned conductive layer.

3. A multiplexer comprising:
a first demultiplexing filter circuit for separating a frequency band including a first RF signal f1, a second RF signal f2, a third RF signal f3 and a fourth RF signal f4 different from one another (where f1<f2<f3<f4) into a frequency band which includes the f1 and the f2 but neither of the f3 and the f4 practically, and a frequency band which includes the f3 and the f4 but neither of the f1 and the f2 practically;
a second demultiplexing filter circuit for separating the frequency band including the f1 and the f2 which is obtained by the separation of the first demultiplexing filter circuit into a frequency band which includes the f1 but none of the f2 to the f4 practically, and a frequency band which includes the f2 but none of the f1, the f3 and the f4 practically; and
a third demultiplexing filter circuit for separating the frequency band including the f3 and the f4 which is obtained by the separation of the first demultiplexing filter circuit into a frequency band which includes the f3 but none of the f1, the f2 and the f4 practically, and a frequency band which includes the f4 but none of the f1 to the f3 practically, wherein the second demultiplexing filter circuit comprises a filter of combination of low-pass and band elimination filters or a band pass filter as a filter where the frequency band including the f2 but none of the f1, the f3 and the f4 practically is set to be a pass band, and the third demultiplexing filter circuit comprises a filter of combination of high-pass and band elimination filters or a band pass filter as a filter where the frequency band including the f3 but none of the f1, the f2 and the f4 practically is set to be a pass band, wherein the first demultiplexing filter circuit comprises a low-pass filter as a filter where the frequency band including the f1 and the f2 but neither of the f3 and the f4 practically is set to be a pass band, and a high-pass filter as a filter where the frequency band including the f3 and the f4 but neither of the f1 and the f2 practically is set to be a pass band.

4. The multiplexer according to claim 3, wherein the second demultiplexing filter circuit comprises a low-pass filter as a filter where the frequency band including the f1 but none of the f2 to the f4 practically is set to be a pass band, and third demultiplexing filter circuit comprises a high-pass filter as a filter where the frequency band including the f4 but none of the f1 to the f3 practically is set to be a pass band.

5. The multiplexer according to claim 3, wherein the multiplexer is formed of a laminated structural body, the laminated structural body is constituted so as to include a plurality of insulating layers and a patterned conductive layer arranged between the insulating layers, each of the first demultiplexing filter circuit, the second demultiplexing filter circuit and the third demultiplexing filter circuit includes an inductance component and a capacitance component, and the inductance component and the capacitance component are formed by using the patterned conductive layer.

6. The multiplexer according to claim 4, wherein the multiplexer is formed of a laminated structural body, the laminated structural body is constituted so as to include a plurality of insulating layers and a patterned conductive layer arranged between the insulating layers, each of the first demultiplexing filter circuit, the second demultiplexing filter circuit and the third demultiplexing filter circuit includes an inductance component and a capacitance component, and the inductance component and the capacitance component are formed by using the patterned conductive layer.

7. A multiplexer comprising:

a first demultiplexing filter circuit for separating a frequency band including a first RF signal f1, a second RF signal f2, a third RF signal f3 and a fourth RF signal f4 different from one another (where f1<f2<f3<f4) into a frequency band which includes the f1 and the f2 but neither of the f3 and the f4 practically, and a frequency band which includes the f3 and the f4 but neither of the f1 and the f2 practically;

a second demultiplexing filter circuit for separating the frequency band including the f1 and the f2 which is obtained by the separation of the first demultiplexing filter circuit into a frequency band which includes the f1 but none of the f2 to the f4 practically, and a frequency band which includes the f2 but none of the f1, the f3 and the f4 practically; and a third demultiplexing filter circuit for separating the frequency band including the f3 and the f4 which is obtained by the separation of the first demultiplexing filter circuit into a frequency band which includes the f3 but none of the f1, the f2 and the f4 practically, and a frequency band which includes the f4 but none of the f1 to the f3 practically, wherein the second demultiplexing filter circuit comprises a filter of combination of low-pass and band elimination filters or a band pass filter as a filter where the frequency band including the f2 but none of the f1, the f3 and the f4 practically is set to be a pass band, and the third demultiplexing filter circuit comprises a filter of combination of high-pass and band elimination filters or a band pass filter as a filter where the frequency band including the f3 but none of the f1, the f2 and the f4 practically is set to be a pass band, wherein the multiplexer is formed of a laminated structural body, the laminated structural body is constituted so as to include a plurality of insulating layers and a patterned conductive layer arranged between the insulating layers, each of the first demultiplexing filter circuit, the second demultiplexing filter circuit and the third demultiplexing filter circuit includes an inductance component and a capacitance component, and the inductance component and the capacitance component are formed by using the patterned conductive layer.

8. The multiplexer according to the claim 7, wherein the insulting layers are made of ceramics.

9. The multiplexer according to claim 8, wherein the patterned conductive layer is made of metal.

* * * * *